(12) United States Patent
Audette et al.

(10) Patent No.: US 11,029,334 B2
(45) Date of Patent: *Jun. 8, 2021

(54) LOW FORCE WAFER TEST PROBE

(71) Applicant: International Business Machines Corporation, Armonk, NY (US)

(72) Inventors: David M. Audette, Colchester, VT (US); Dennis R. Conti, Essex Junction, VT (US); Marc D. Knox, Hinesburg, VT (US); Grant W. Wagner, Jericho, VT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/536,620

(22) Filed: Aug. 9, 2019

(65) Prior Publication Data

US 2019/0361048 A1    Nov. 28, 2019

Related U.S. Application Data

(63) Continuation of application No. 15/208,185, filed on Jul. 12, 2016, now Pat. No. 10,444,260.

(51) Int. Cl.
*G01R 1/067* (2006.01)

(52) U.S. Cl.
CPC ...... *G01R 1/06711* (2013.01); *G01R 1/06733* (2013.01)

(58) Field of Classification Search
CPC ............ G01R 1/06733; G01R 1/06711; G01R 31/2635; G01R 31/2891; H01L 23/481; H01L 24/11; H01L 24/13

USPC ................. 324/500, 754.01, 754.07–754.11, 324/754.2–755.01, 755.11, 756.03, 324/758.01, 690

See application file for complete search history.

(56) References Cited

U.S. PATENT DOCUMENTS

| | | |
|---|---|---|
| 5,461,326 A | 10/1995 | Woith et al. |
| 6,181,149 B1 | 1/2001 | Godfrey et al. |
| 6,469,531 B1 | 10/2002 | Sayre et al. |
| 6,690,185 B1 | 2/2004 | Khandros et al. |
| 7,086,149 B2 | 8/2006 | Eldridge et al. |

(Continued)

OTHER PUBLICATIONS

J. U. Knickerbocker et al., "2.5 D and 3D technology challenges and test vehicle demonstrations," 62nd Electronic Components and Technology Conference (ECTC), 2012, pp. 1068-1076.

(Continued)

*Primary Examiner* — Melissa J Koval
*Assistant Examiner* — Trung Q Nguyen
(74) *Attorney, Agent, or Firm* — Cantor Colburn LLP; Erik Johnson

(57) ABSTRACT

A probe includes a pedestal and at least one feature extending from the pedestal to engage a surface of a corresponding contact at a position offset from a central longitudinal axis of the contact. The pedestal includes a cavity and the feature can include one or more blades that extend from a periphery of the cavity to a central longitudinal axis of the pedestal. The three blades are configured to engage the surface of the contact. The three blades can be positioned within the cavity to provide a 120-degree rotational symmetry about the central longitudinal axis of the pedestal.

10 Claims, 4 Drawing Sheets

(56) References Cited

U.S. PATENT DOCUMENTS

| | | | |
|---|---|---|---|
| 7,394,265 B2 | 7/2008 | Kojima | |
| 7,560,941 B2 | 7/2009 | Martens et al. | |
| 7,629,804 B2 | 12/2009 | Nguyen et al. | |
| 7,843,198 B2 | 11/2010 | Sato et al. | |
| 8,487,304 B2 | 7/2013 | Chey et al. | |
| 9,472,490 B1 * | 10/2016 | Sullivan | H01L 21/76898 |
| 10,261,108 B2 | 4/2019 | Audette et al. | |
| 2004/0004216 A1 | 1/2004 | Eldridge et al. | |
| 2008/0179611 A1 * | 7/2008 | Chitnis | H01L 33/508 |
| | | | 257/98 |
| 2010/0071100 A1 | 3/2010 | Faris | |
| 2018/0017592 A1 | 1/2018 | Audette et al. | |
| 2018/0017596 A1 | 1/2018 | Audette | |

OTHER PUBLICATIONS

List of IBM Patents or Patent Applications Treated as Related (Appendix P); Date Filed: Aug. 9, 2019, 2 pp. 1-2.

* cited by examiner

LOW FORCE WAFER TEST PROBE

DOMESTIC PRIORITY

This application is a continuation of U.S. application Ser. No. 15/208,185, titled "Low Force Wafer Test Probe" filed Jul. 12, 2016, the contents of which are incorporated by reference herein in its entirety.

BACKGROUND

The present invention generally relates to testing wafers on which electronic circuits are formed, and more particularly, to a test configuration for testing an electronic circuit.

An important facet of the semiconductor industry resides in being able to provide satisfactorily functioning semiconductor devices. In particular, such semiconductor devices may comprise wafers which are divided into areas which form chips, the shapes and dimensions of which are as close to identical as possible, so as to impart consistent uniform electrical properties thereto.

Generally, semiconductor devices on chips are ordinarily connected to each other with thin strips of metal, referred to in the art as interconnection metallurgy, which in turn contact the wafer surface through a series of pads or bumps. Other connector pad configurations may include an array of electrical contacts or bumps which are distributed over an area; for instance, the widely employed C4 bumps (controlled collapse chip connects). Such bumps or electrical contacts extend above the integrated circuits and have a generally spherical or round cross-sectional configuration.

Although wafers are formed as uniformly as possible through current manufacturing techniques, it is not always feasible that every chip produced is perfect. In order to identify defective chips, electrical tests are performed to facilitate the sorting out of good chips and eliminating defective chips prior to the next step of manufacture.

Ordinarily, active testing of the wafers is performed by a test facility in which the pads or areas on wafers possessing arrays of bumps, such as of C4 bumps, are contacted by an assembly incorporating test probes. In order to successfully probe the integrity of the pads or bumps, it is desirable that an oxide layer, which inevitably forms on the surface of the C4 bumps, be ruptured and penetrated to ensure good electrical contact with the probe while employing only a minimal force to inhibit damaging the pads or bumps.

SUMMARY

In one aspect, the present invention provides a probe including a pedestal and at least one feature extending from the pedestal to engage a surface of a corresponding contact at a position offset from a central longitudinal axis of the contact.

In one aspect, an embodiment of the present invention provides a probe including a pedestal and at least one feature extending from the pedestal to engage a surface of a corresponding contact. The at least one feature applies a lateral force to the contact to urge the contact into a desired position relative to the probe when the contact is misaligned relative to the probe.

In another aspect, an embodiment of the present invention provides a probe including a pedestal and at least one feature extending from the pedestal to engage a surface of a corresponding contact. The at least one feature is configured to shear an outer surface of the contact.

In one aspect, an embodiment of the present invention provides a probe including a pedestal and a cavity extending inwardly from a first end of the pedestal. At least one feature is formed within the cavity to engage a surface of a corresponding contact. A radial diameter of the at least one feature is less than ⅕ of a diameter of the contact to minimize the contact force applied by the at least one feature to the contact.

In another aspect, an embodiment of the present invention provides a probe including a pedestal and a cavity extending inwardly from a first end of the pedestal. At least one feature formed within the cavity is configured to engage a surface of a corresponding contact. A configuration of the at least one feature is selected such that a first test and a second test are performed on the contact without a reflow operation.

In one aspect, an embodiment of the present invention provides a probe includes a pedestal and at least one feature extending from the pedestal to engage a surface of a corresponding contact. The probe being configured such that when the probe is engaged with the contact, a center of the contact remains undeformed.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings.

DETAILED DESCRIPTION

Citation of "a specific embodiment" or a similar expression in the specification means that specific features, structures, or characteristics described in the specific embodiments are included in at least one specific embodiment of the present invention. Hence, the wording "in a specific embodiment" or a similar expression in this specification does not necessarily refer to the same specific embodiment.

Hereinafter, the present invention and various embodiments of the present invention will be described in more detail with reference to the accompanying drawings. Nevertheless, it should be understood that the present invention could be modified by those skilled in the art in accordance with the following description to achieve the excellent results of the present invention. Therefore, the following description shall be considered as a pervasive and explanatory disclosure related to the present invention for those skilled in the art, not intended to limit the claims of the present invention.

Figure 1:
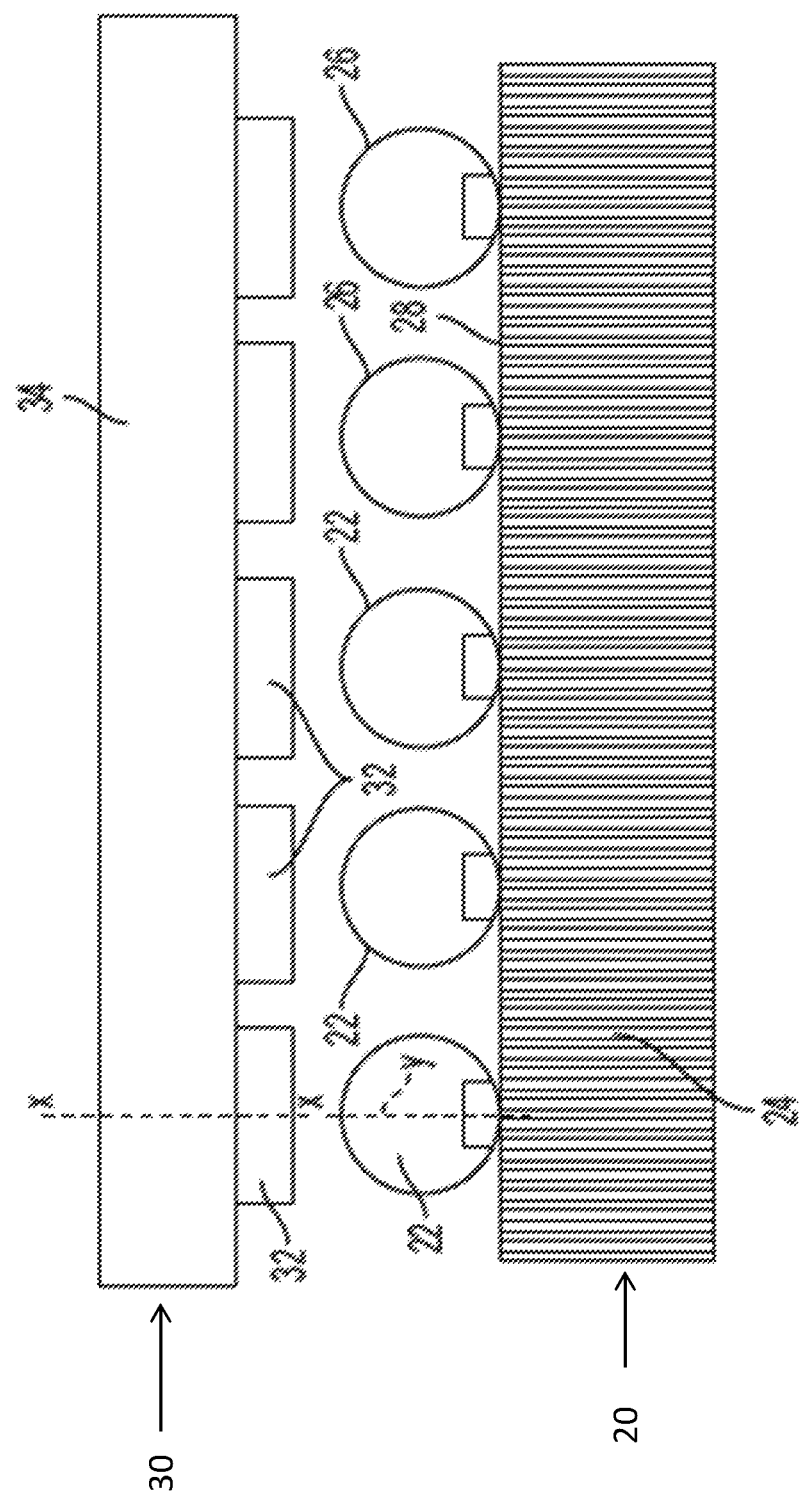
FIG. 1 is side view of a system including an array of probes and a wafer in an inactive position according to an embodiment.

Referring now to FIG. 1, an example of an array 30 of test probes 32 used to test the electrical conductivity of an electrical semiconductor wafer 20 is illustrated. The semiconductor wafer 20 includes a plurality of conductive bumps 22, also referred to as controlled collapse chip connects ("C4 bumps"), which have a generally spherical or curved top shape. The semiconductor wafer 20 may include a base layer 24 formed from a substrate, such as a silicon material for example, having a specific structure or openings. The base layer 24 may include a single or multiple layers of material. The wafer 20 as supported in a test fixture may or may not have the capability of moving in one or more directions prior to electrical contact for indexing the position of the wafer 20 and the circuit on the wafer 20 to be tested.

Figure 2:
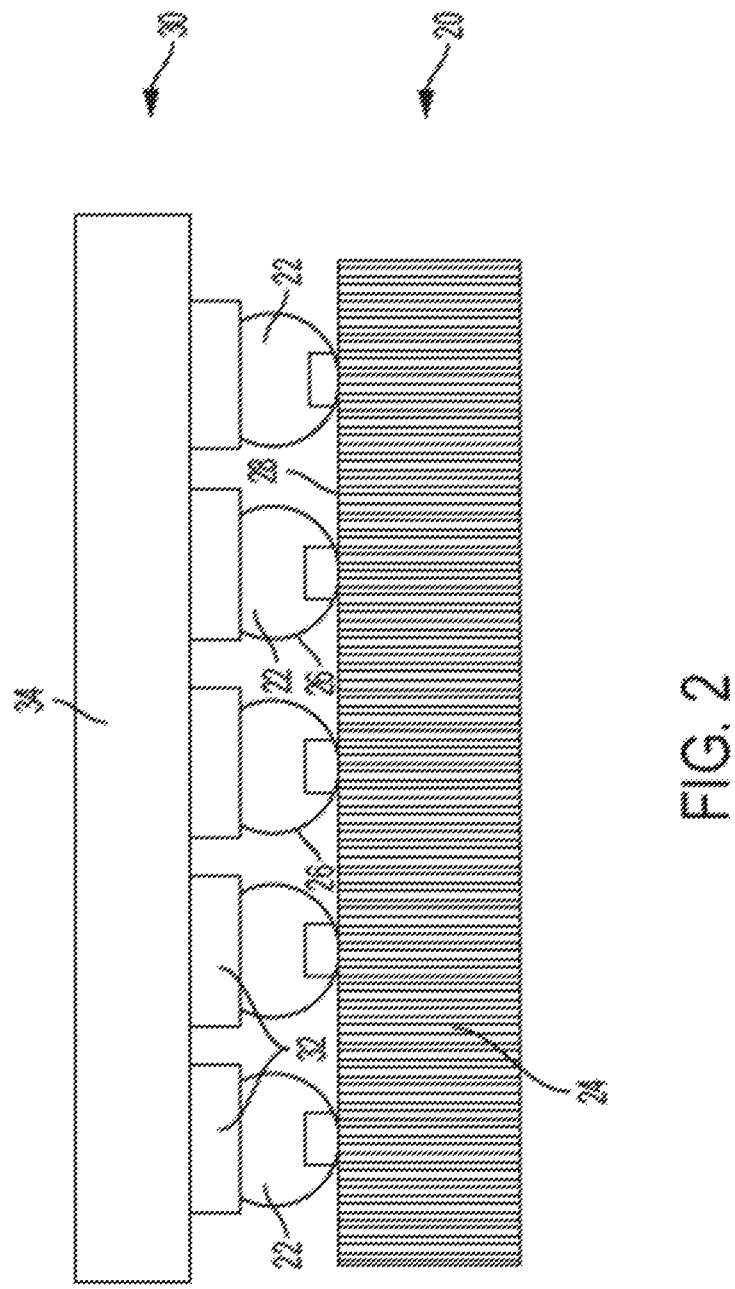
FIG. 2 is side view of a system including an array of probes and a wafer in an active position according to an embodiment.

As shown, the probes 32 of the array 30 are mounted to a structure 34 in a configuration such that each probe 32 is substantially aligned with one of the C4 bumps 22 on a semiconductor wafer 20. Each of the probes 32 has a longitudinal axis X which passes through the center of the probe 32 such that a height of each probe 32 may be measured along the longitudinal axis. When the probe 32 is in contact with C4 bumps 22, as shown in FIG. 2, the distance between the structure 34 and the C4 bumps 22 is less than the length of the probes 32, to ensure that a pressure or force is applied to each of the C4 bumps 22. The pressure or force provides penetration of the C4 bumps 22 resulting in piercing and exposing a new clean contact surface free of oxide below the former surface 26 of the C4 bump 22.

Figure 3:
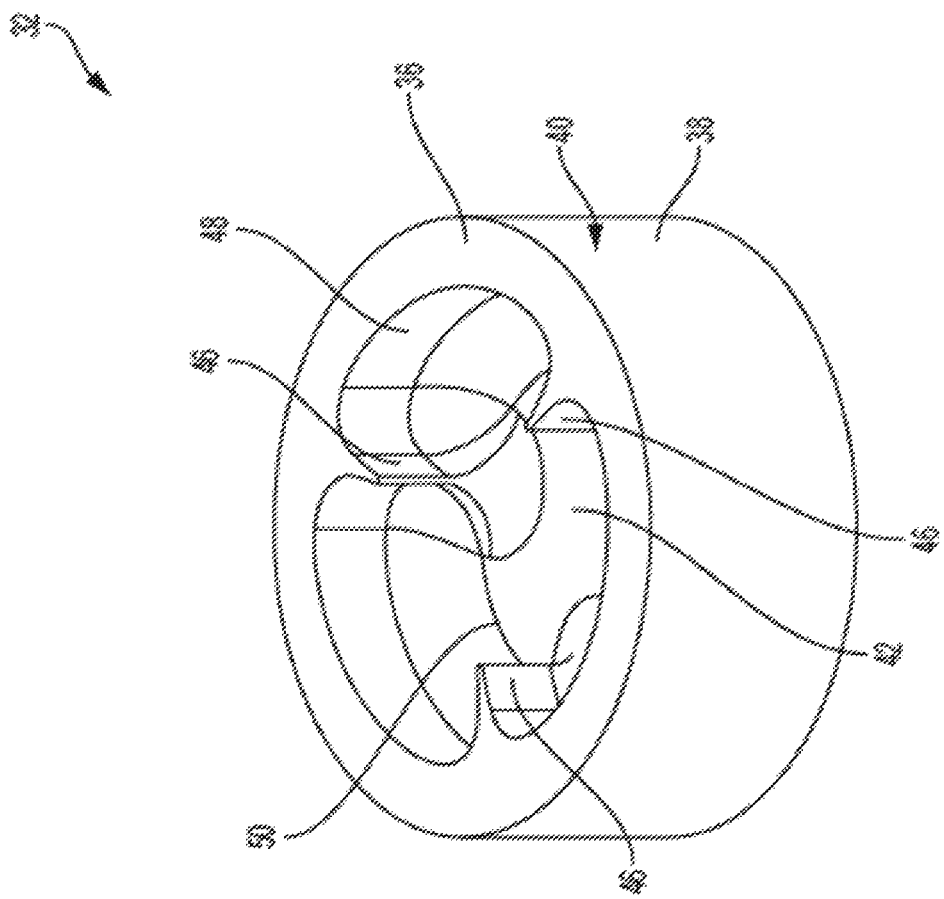
FIG. 3 is a perspective view of a probe according to an embodiment.
Figure 4:
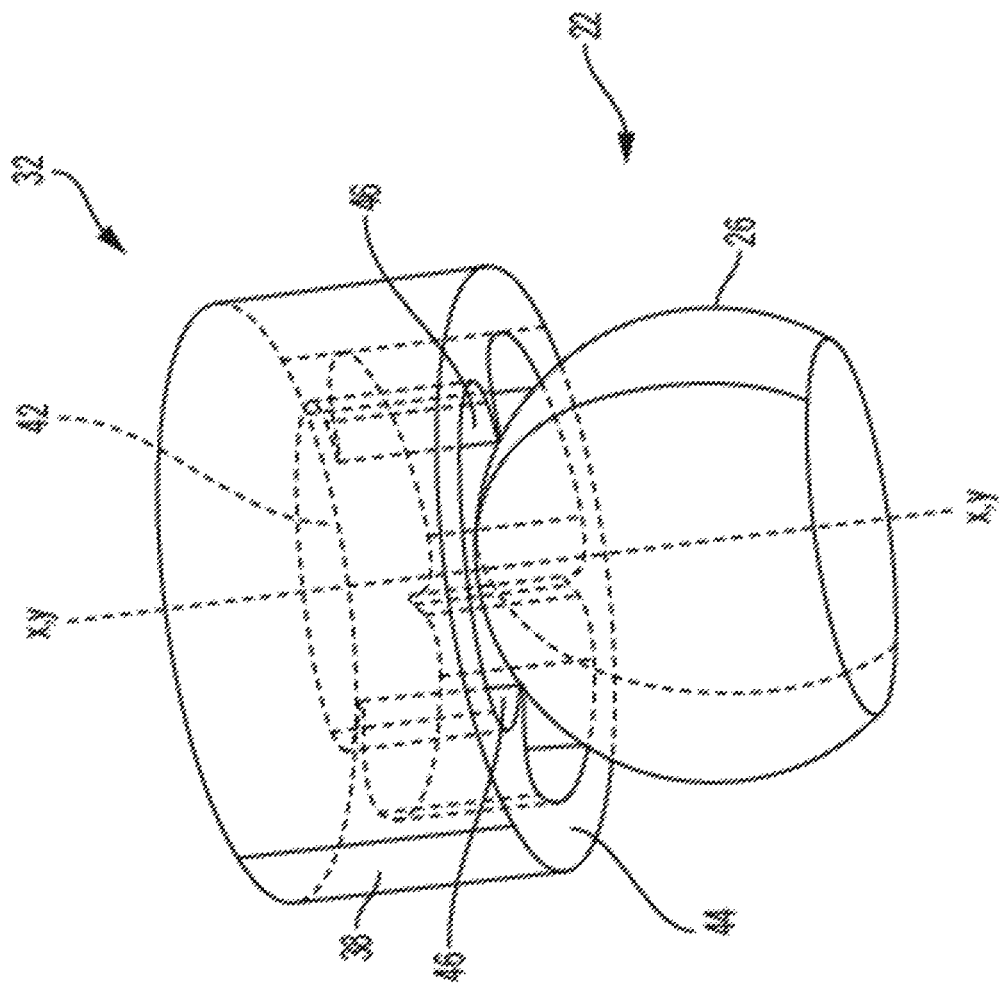
FIG. 4 is a perspective view of the probe of FIG. 3 arranged in engagement with a C4 bump according to an embodiment.

Referring now to FIGS. 3 and 4, a perspective view of a probe 32 configured for use in the array 30 and configured to engage a corresponding contact on the wafer 20 is illustrated. The probe 32 is formed from a substantially rigid material, such as copper for example. In the illustrated, non-limiting embodiment, the probe 32 includes a generally cylindrical pedestal 40 having a cavity 42 formed therein. The cavity 42 may be formed through any suitable process, such as by removing material via photo etching or micromachining, or alternatively, may be formed through an additive manufacturing process such as electroplating for example.

The cavity 42 extends inwardly from a first planar surface at the first end 36 of the probe 32 positioned generally adjacent and parallel to the upper surface 28 of the wafer 20. The diameter of the cavity 42 may vary based on the size of a corresponding C4 bump 22 that the probe 32 is configured to contact; however, the diameter of the cavity 42 is generally less than the diameter of the C4 bump 22 such that during a test operation, only a limited portion of the C4 bump 22 is received within the cavity 42.

Formed within the cavity 42 are one or more features 46 configured to contact the exterior surface 26 of the C4 bump 22. In an embodiment, the features 46 include blades that extend generally inwardly from the periphery of the cavity 42 towards a central axis thereof. The illustrated, non-limiting embodiment includes three blades 46 spaced substantially equidistantly about the periphery of the sidewall 48 of the cavity 42. However, embodiments having any number of features 46 located at any position about the cavity 42 are contemplated herein. The support of these features 46 by an outer ring or pedestal 40 increases the strength of the probe elements 32 and reduces the stress of the probe 32 generated during contact with a corresponding C4 bump. This described configuration allows for the use of smaller features, thereby achieving a lower force performance than required by a probe having a free standing pin structure. In addition, these smaller, sharper, strategically placed features 46 impart higher localized stress on the C4 bumps for purpose of piercing the oxide layer, while minimizing global deformation.

The portion of each blade 46 adjacent the first end 36 of the probe 32, extends generally vertically, parallel to the exterior surface 38 of the probe 32 and the central longitudinal axis of the probe 32 and the C4 bump. As the blade 46 approaches the interior end 50 of the cavity 42, the blades may have a contour, such as a radius for example, generally complementary to the contour of the cavity 42. With such an arrangement, the features 46 are generally configured to contact a portion of the C4 bump 22 offset from the central longitudinal axis Y thereof. As a result, the center of the C4 bump 22 remains undisturbed through the testing, thereby eliminating the need for a reflow operation. In addition, the orientation and contour of the features 46 may be selected to apply a lateral force on the C4 bump 22 to urge the corresponding C4 bump 22 into a desired position within the cavity 42 in the event that central axis of the probe 32 and central axis of the C4 bump 22 are misaligned. By including a plurality of features 46 positioned about the periphery of the cavity 42, the features 46 ensure proper alignment between the probe and C4 bump 22 regardless of the direction of offset of the C4 bump 22 relative to the probe 32.

The portion of each feature 46 configured to contact a C4 bump 22 is generally small in relation to not only the surface area of the C4 bump 22 but also to the diameter of the probe 32. For example, a total surface area of the plurality of features configured to engage the contact is generally less than 10%, such as between about 5% and 10% of a total surface area of the contact. In an embodiment, the radial thickness of each feature is between $\frac{1}{20}$ and $\frac{1}{5}$ of the outer diameter of the C4 bump 22. In an embodiment, the portion of each feature 46 configured to contact the C4 bump 22 is designed to shear the surface layer 26 of the C4 bump 22, as opposed to compressing the surface 26 as occurs with conventional probes. This shearing that occurs maximizes the displacement of the oxide layer and provides optimized electrical contact between the probe 32 and an unoxidized solder layer.

By limiting the area of contact between the features 46 and the C4 bump 22, the stress at the interface between the probe 32 and a corresponding C4 bump 22 may be reduced or even minimized. In addition, the amount of solder that is deformed during a test is also reduced. As a result, multiple tests may be performed on a C4 bump 22 before the solder of the C4 bump 22 requires reforming. For example, a first test using a first probe having one or more features 46 as described herein may be performed on a C4 bump 22. A second test may then be performed using a second probe having features 46 positioned at different areas of the C4 bump 22 than the first probe. The first probe and the second probe may have different configurations, or alternatively may be substantially identical, but oriented at an angle relative to one another.

It should be understood that the probe illustrated and described herein is intended as an example only and that other probe configurations are also within the scope of the disclosure.

The foregoing detailed description of the embodiments is used to further clearly describe the features and spirit of the present invention. The foregoing description for each embodiment is not intended to limit the scope of the present invention. All kinds of modifications made to the foregoing embodiments and equivalent arrangements should fall within the protected scope of the present invention. Hence, the scope of the present invention should be explained most widely according to the claims described thereafter in connection with the detailed description, and should cover all the possibly equivalent variations and equivalent arrangements.

The invention claimed is:

1. A method for manufacturing a wafer test probe, the method comprising:
   forming a pedestal having a first end and a second end, the pedestal comprising a cavity that extends from a first planar surface of the first end towards the second end; and
   forming three blades extending from a periphery of the cavity to a central longitudinal axis of the pedestal, the three blades configured to engage a surface of a contact at a position offset from a central longitudinal axis of the contact, each of the three blades comprising a first surface coplanar to the first planar surface and a second surface parallel to the central longitudinal axis of the pedestal;
   wherein the three blades are positioned within the cavity such that the three blades and the cavity provide a 120-degree rotational symmetry about the central longitudinal axis of the pedestal.

2. The method according to claim 1, wherein the three blades are formed within an interior of the cavity.

3. The method according to claim 1, wherein the three blades are substantially identical.

4. The method according to claim 1, wherein the three blades are equidistantly spaced about the periphery of the cavity.

5. The method according to claim 1, wherein the three blades are configured to shear a surface of the contact to maximize displacement of an oxide layer formed at the surface of the contact.

6. The method according to claim 1, wherein the three blades are configured to minimize stress within the wafer test probe that occurs during engagement with the contact.

7. The method according to claim 1, wherein the three blades are configured to minimize deformation at an area of engagement between the three blades and a surface of the contact, thereby reducing a contact force applied to the contact.

8. A method for conducting a low force wafer test, the method comprising:
   providing a wafer test probe configured to minimize stress that occurs during engagement with a contact of a wafer, the wafer test probe comprising:
      a pedestal having a first end and a second end, the pedestal comprising a cavity that extends from a first planar surface of the first end towards the second end; and
      three blades extending from a periphery of the cavity to a central longitudinal axis of the pedestal, the three blades configured to engage a surface of a contact at a position offset from a central longitudinal axis of the contact, each of the three blades comprising a first surface coplanar to the first planar surface and a second surface parallel to the central longitudinal axis of the pedestal, wherein the three blades are positioned within the cavity such that the three blades and the cavity provide a 120-degree rotational symmetry about the central longitudinal axis of the pedestal; and
   engaging the wafer test probe with a surface of the contact such that a portion of the contact is received within the cavity.

9. The method according to claim 8, wherein a total surface area of the three blades comprises less than 10% of a total surface area of the contact.

10. The method according to claim 8, wherein a radial thickness of each of the three blades comprises between 5% and 20% an outer diameter of the contact.

* * * * *